(12) United States Patent
Cho

(10) Patent No.: US 7,053,482 B2
(45) Date of Patent: May 30, 2006

(54) CERAMIC PACKAGE WITH RADIATING LID

(75) Inventor: Seong Won Cho, Seoul (KR)

(73) Assignee: Samsung Electro-Mechanics Co., Ltd., Kyungki-do (KR)

(*) Notice: Subject to any disclaimer, the term of this patent is extended or adjusted under 35 U.S.C. 154(b) by 303 days.

(21) Appl. No.: 10/320,659

(22) Filed: Dec. 17, 2002

(65) Prior Publication Data
US 2003/0218240 A1 Nov. 27, 2003

(30) Foreign Application Priority Data
May 27, 2002 (KR) .......................... 2002-29182

(51) Int. Cl.
*H01L 23/12* (2006.01)

(52) U.S. Cl. .......................... 257/704; 257/712

(58) Field of Classification Search .................. 257/686, 257/700–701, 703–706, 712–713, 718, 722
See application file for complete search history.

(56) References Cited

U.S. PATENT DOCUMENTS 4,092,697 A * 5/1978 Spaight ...................... 361/718
5,376,825 A * 12/1994 Tukamoto et al. .......... 257/685
5,977,623 A * 11/1999 Ahn ............................ 257/693

FOREIGN PATENT DOCUMENTS

| JP | 55165658 A | * 12/1980 |
| JP | 56133853 A | * 10/1981 |
| JP | 62-057238 | 3/1987 |
| JP | 05-029485 | 2/1993 |
| JP | 08-083867 | 3/1996 |
| JP | 08-195451 | 7/1996 |

* cited by examiner

*Primary Examiner*—Long Pham
*Assistant Examiner*—Ginette Peralta
(74) *Attorney, Agent, or Firm*—Lowe Hauptman Gilman & Berner, LLP

(57) ABSTRACT

A ceramic package with a lid attached thereon, which has radiating grooves at its upper surface and/or lower surface to radiate heat generated from a chip-type device is disclosed. The ceramic package includes a laminated ceramic substrate comprised of a plurality of ceramic substrate such that a cavity is centrally defined in the laminated ceramic substrate, a chip-type device mounted on the bottom of the cavity of the laminated ceramic substrate, and a lid attached to the top of the laminated ceramic substrate to close the cavity, which is provided at its upper and/or lower surface with protrusions to efficiently radiate heat generated from the chip-type device.

15 Claims, 5 Drawing Sheets

CERAMIC PACKAGE WITH RADIATING LID

BACKGROUND OF THE INVENTION

1. Field of the Invention

The present invention relates to a ceramic package with a lid for radiating and eliminating unwanted heat generated from a chip-type device during an operation of the device, and more particularly to a ceramic package with a lid covering the ceramic package, which is provided at its upper surface with radiating grooves or pins to allow heat generated from the chip-type device to be efficiently radiated to the outside.

2. Description of the Prior Art

In general, a chip-type device mounted on a product is sure to generate heat during its operation. Since such heat gives birth to noise or malfunction of the device, various structures for radiating heat are in demand.

In particular, in order to manufacture simple and light mobile phones, surface acoustic wave filters (referred to as "SAW filters" hereinafter) and surface acoustic wave duplexers (referred to as "SAW duplexers" hereinafter) have become more and more miniaturized. With the popularization of such compact SAW duplexers, SAW duplexers having the dimensions of 5.0 mm×5.0 mm are extensively used, which are smaller than the dimensions of 9.5 mm×7.5 mm, and products having the dimensions of 3.8 mm×3.8 mm are in the process of being developed.

In accordance with miniaturization of products, packages are also being miniaturized. Due to the miniaturization of packages, there is a problem in heat radiation of chip-type devices such as SAW filters.

As shown in FIG. 1, an SAW duplexer 102 which is one such chip-type device, is surface-mounted on a package substrate 100, which is prepared by a plurality of laminated substrates with a cavity 112 therein. The package substrate 100 on which the SAW duplexer 102 is mounted is provided at its bottom with via holes 110. The via holes 110 are filled with electrode material to transfer heat. Furthermore, the package substrate 100 is provided over the cavity with a lid 106, which is attached to the top surface of the package substrate 100 by a brazing process. The substrate on which the SAW duplexer 102 is mounted includes a phase control circuit 108 therein.

In the manufacture of the package substrate, since the electrodes 110 are embedded in the bottom of the package substrate on which the SAW duplexer 102 is mounted, roughness is caused by deterioration of the bottom surface, thereby causing difficulty in mounting of the SAW duplexer 100. In addition, because of the unevenness of the bottom surface, the upper surface of the SAW duplexer 102 is not level at the time of wire bonding process, thereby increasing the failure rate of wire bonding. If the via holes 110 filled with the electrodes are pressed at the time of the laminating procedure, the electrode surfaces are expanded, causing deformation of the ceramic green sheet. This results in a camber phenomenon of the package.

In a conventional ceramic package shown in FIG. 2, it is necessary to control the impedance of a receiver 130 to be infinitely great so as not to permit signals outputted from a transmitter 120 from being inputted to the receiver 130 rather than a antenna 140. To this end, the phase control circuit 108 must be provided between the antenna 140 and the receiver 130. However, since the phase control circuit 108 must be formed in a substrate to be separated from the via holes 110, there is a limitation in its design.

SUMMARY OF THE INVENTION

Accordingly, the present invention has been made keeping in mind the above problems occurring in the prior art, and an object of the present invention is to provide a ceramic package with a lid covering on the top surface of a package substrate, which is intended to radiate heat generated during an operation of a chip-type device such as an SAW filter, by improving the configuration of the lid to allow the heat to be radiated therefrom, instead of the formation of additional via holes for transferring heat.

Another object of the present invention is to provide a ceramic package with a radiating lid which is intended to assure reliability of products, simplification of its manufacturing process and enhancement of productivity by heat transfer through the improved lid structure without via holes.

Yet another object of the present invention is to provide a ceramic package with a radiating lid which is intended to assure the space required for formation of a phase control circuit and a reduction of limitation in its design by elimination of via holes.

A further object of the present invention is to provide a ceramic package with a radiating lid adapted to radiate heat generated from a chip-type device and to maintain its air-tight condition.

In order to accomplish the above objects, the present invention provides a ceramic package comprising: a laminated ceramic substrate comprised of a plurality of ceramic substrate such that a cavity is centrally defined in the laminated ceramic substrate; a chip-type device mounted on the bottom of the cavity of the laminated ceramic substrate; and a lid attached to the top of the laminated ceramic substrate to close the cavity, which is provided at its upper and lower surface with protrusions to efficiently radiate heat generated from the chip-type device.

The present invention provides a ceramic package comprising: a laminated ceramic substrate comprised of a plurality of ceramic substrate such that a cavity is centrally defined in the laminated ceramic substrate; a chip-type device mounted on the bottom of the cavity of the laminated ceramic substrate; and a lid attached to the top of the laminated ceramic substrate to close the cavity, which is provided at its upper surface with grooves, and is provided at its lower surface with a downwardly protruded surface, the protruded surface of the lid being fitted in an upper inlet portion of the cavity.

The present invention provides a ceramic package comprising: a laminated ceramic substrate comprised of a plurality of ceramic substrate such that a cavity is centrally defined in the laminated ceramic substrate; a chip-type device mounted on the bottom of the cavity of the laminated ceramic substrate; and a lid attached to the top of the laminated ceramic substrate to close the cavity, which is provided at its upper surface with grooves, and is provided at its lower surface with a downwardly protruded surface, the lower protruded surface of the lid being fitted in an upper inlet portion of the cavity and being provided with protrusions.

BRIEF DESCRIPTION OF THE DRAWINGS

The above and other objects, features and advantages of the present invention will be more clearly understood from the following detailed description taken in conjunction with the accompanying drawings, in which:

FIG. 1 is a cross-sectional view of a conventional ceramic package on which a chip-type device is mounted.

DETAILED DESCRIPTION OF THE INVENTION

This invention will be described in further detail by way of example with reference to the accompanying drawings.

The ceramic package with a radiating lid according to the present invention is characterized in that a substrate having a chip-type device mounted thereon is not formed with via holes, and the lid for closing a cavity of a package substrate is modified, unlike a conventional ceramic package.

Figure 1:
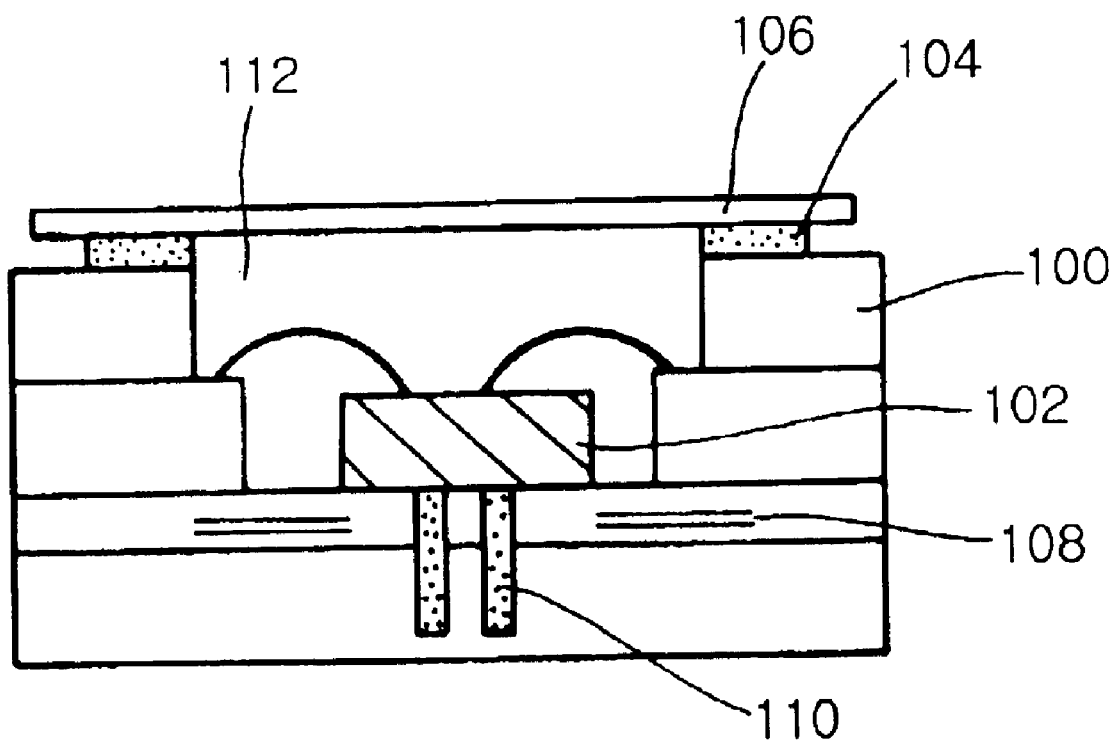
Figure 2:
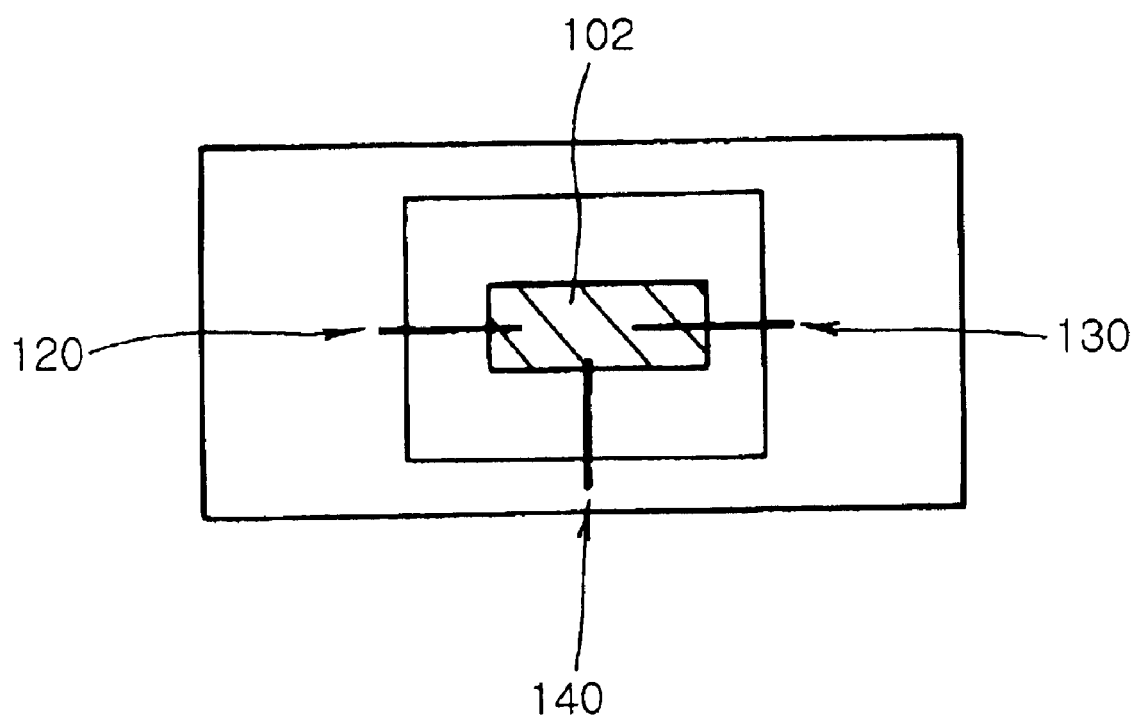
FIG. 2 is a plan view of a chip-type device such as an SAW filter mounted on a ceramic package.
Figure 3:
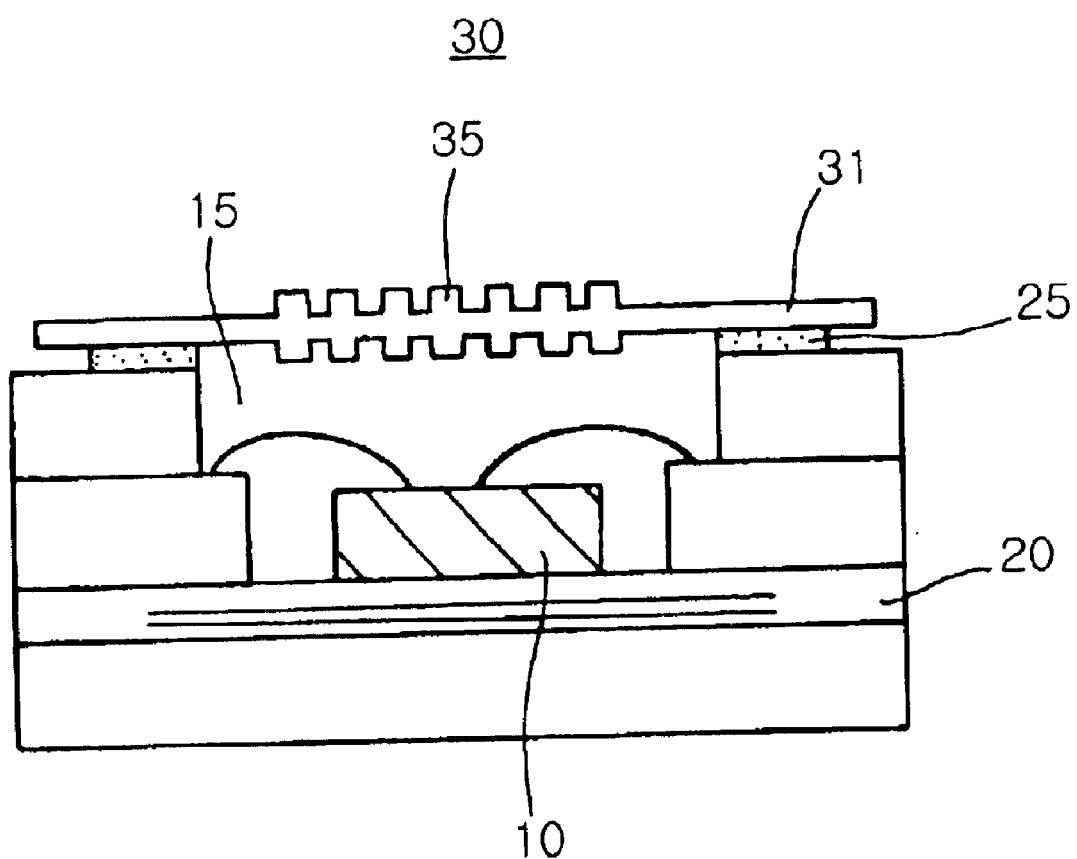
FIG. 3 is a cross-sectional view of a ceramic package with an improved lid according to the present invention.

FIG. 3 is a cross-sectional view of a ceramic package with an improved lid according to the present invention. As shown in the drawing, a ceramic package 30 includes a chip-type device 10 mounted in a cavity 15 internally formed in a laminated substrate 20. The chip-type device 10 is a kind of heating element such as a semiconductor, an SAW filter and a quartz oscillator, and is described focusing on the SAW filter in the following embodiments. The laminated substrate is made of ceramic excellent in thermal conductivity and is comprised of the bottom substrate and substrates defining walls of the package.

In FIG. 3, the ceramic package 30 is shown to have a lid 31 for closing the cavity 15 formed in the laminated substrate 20. The lid 31 is attached to the top surface of the ceramic package 30 by a brazing material 25. The lid 31 is provided at its upper and lower surfaces with protrusions 35. The protrusions 35 may be formed by providing a plurality of linear grooves on the upper and lower surfaces of the lid 31, or may be comprised of a plurality of linear protruded pins, each of which has a certain section such as a square or a semicircle. By providing the protrusions 35 on the lid 31, heat generated from the chip-type device 10 received in the cavity 15 can be efficiently radiated to the outside through the lid 31. More specifically, by increasing the surface area of the lid 31 with the protrusions 35, a larger amount of heat can be radiated, when compared to a conventional ceramic package.

In addition, the ceramic package according to this embodiment of the present invention can radiate a sufficient amount of heat by the protrusions formed on the lid 31, even though the bottom surface of the ceramic package on which the SAW filter as the chip-type device 10 is mounted is not provided with via holes.

Figure 4:
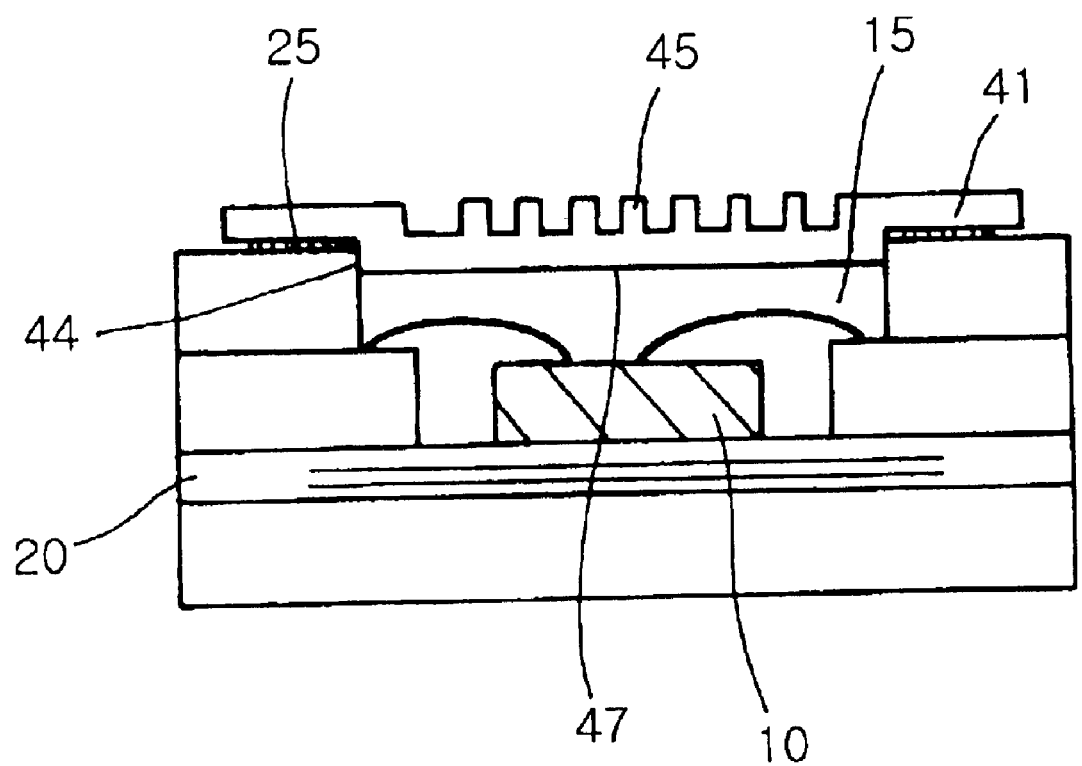
FIG. 4 is a cross-sectional view of a ceramic package with an improved lid according to another embodiment of the present invention.

FIG. 4 is a cross-sectional view of a ceramic package with an improved lid according to another embodiment of the present invention. As illustrated in the drawing, a ceramic package 40 according to this embodiment includes a laminated substrate 20 similar to that of the ceramic package 30 shown in FIG. 3, and a chip-type device 10 mounted in a cavity 15 internally formed in a laminated substrate 20. This embodiment is different, however, from the embodiment of FIG. 3 in that a lid 41 is provided at its lower side with a downwardly protruded surface 47.

More specifically, the lid 41 is provided at its lower side with the lower protruded surface 47 such that a stepped surface 44, defining the lower protruded surface 47, is fitted into an upper inlet portion of the cavity 15. By providing the stepped surface 44 on the lower surface of the lid 41, the lid 41 can be automatically positioned with respect to the ceramic package 40 when the lid 41 is mounted on the laminated substrate 20. Therefore, its manufacturing process is simplified and an airtight condition of the cavity 15 can be maintained. Furthermore, since the lid 41 is formed at its upper surface with grooves 45, it is possible to prevent the upper surface of the lid 41 from interfering with other components. Weakening of the lid 41 by formation of the grooves 45 can be compensated by the lower protruded surface 47. In this embodiment, since the lid 41 is provided at its upper surface with grooves 45, upper surfaces of protrusions defined by the protrusions 45 are flush with the upper surface of the lid with no protrusions higher than the upper surface of the lid.

Like the embodiment shown in FIG. 3, the grooves 45 may be formed by providing a plurality of linear grooves on the upper surfaces of the lid 41, or may be comprised of a plurality of pin-shaped grooves, each of which has a certain section such as a square or a semicircle. By providing the grooves 45 on the lid 41, heat generated by the chip-type device 10 received in the cavity 15 can be efficiently radiated to the outside through the lid 31. The lid 41 is attached to the top of the ceramic package 40 by a brazing material 25, as in the embodiment shown in FIG. 3.

Figure 5:
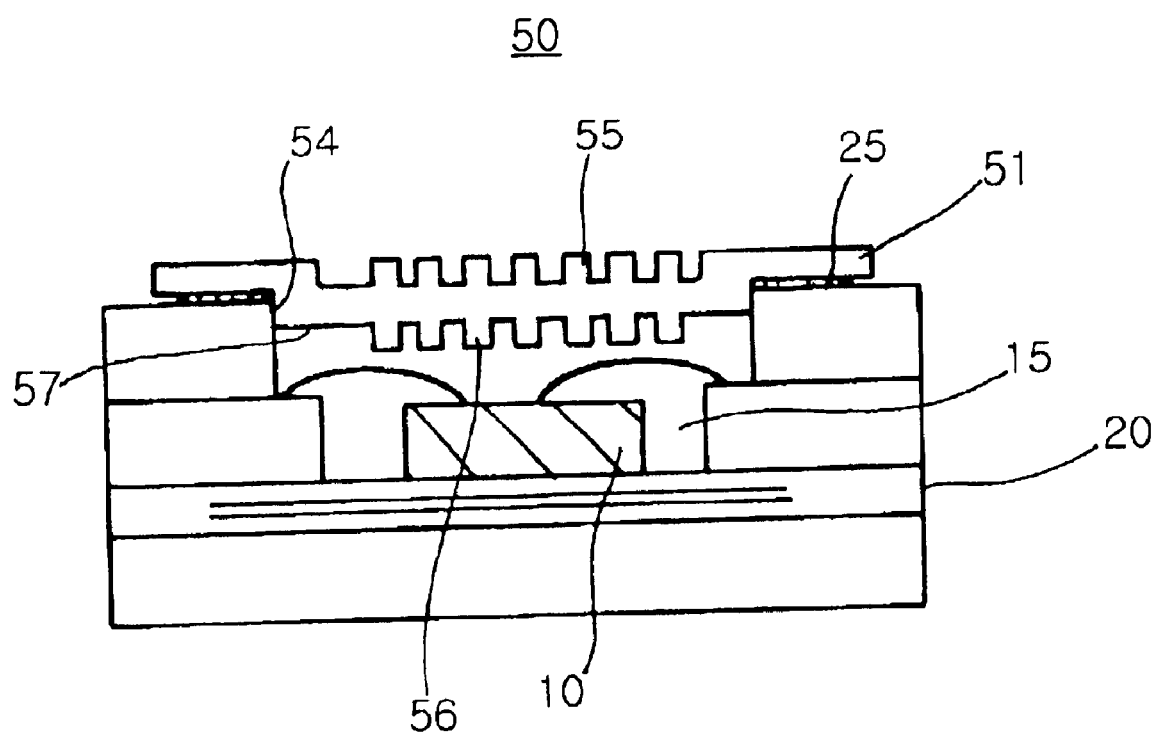
FIG. 5 is a cross-sectional view of a ceramic package with an improved lid according to still another embodiment of the present invention.

FIG. 5 is a cross-sectional view of a ceramic package with an improved lid according to still another embodiment of the present invention. As shown in the drawing, this embodiment is configured by adding protrusions 56 to the lid according to the embodiment shown in FIG. 4. More specifically, this embodiment is substantially equal to the embodiment shown in FIG. 4 in that a lid 51 is provided at its upper surface with grooves 55 and at its lower surface with a downwardly protruded surface 57, and a stepped surface 54, defining the lower protruded surface 57, is fitted into an upper inlet portion of a cavity 15 of the laminated substrate 20. This embodiment is different from the above embodiment, however, in that the lid 51 is further provided at its lower protruded surface with protrusions 56.

The lid 51 according to this embodiment can provide a larger surface area required to radiate heat, as compared with the lid 41 according to the above embodiment shown in FIG. 4. By incorporating the lid 51 in a ceramic package, the ceramic package can more efficiently radiate heat, generated from the chip-type device 10, to the outside.

In accordance with this embodiment shown in FIG. 5, the lid 51 can be easily positioned with respect to the laminated substrate 20 by the stepped surface 54 of the lid 51, and it is possible to increase the air-tight ability of the ceramic package, and to reduce influence by interference of the upper surface of the lid by causing upper surfaces of protrusions, defined by the grooves 55, to be flush with the upper surface of the lid 51.

Since a ceramic substrate for use in such a package is manufactured in such a way that ceramic sheets are subjected to punching and electrode printing procedures, and is formed with via holes which are then filled with electrodes, followed by a baking procedure, its manufacturing process must be precisely carried out and becomes complicated. Accordingly, when a chip is miniaturized, the above-described conventional ceramic package has disadvantages in that the design becomes difficult because the space required for design of an internal circuit is reduced. Additionally, the error rate is increased and breakage of sheets and bending of the substrate are frequently generated because the spacing between via holes is reduced. Such disadvantages of a conventional ceramic package can be solved by the present invention.

In other words, the configuration of the lid according to the present invention, which includes protrusions or grooves at its upper and lower surfaces, can not only solve the above-mentioned disadvantages of a conventional ceramic package, but can also obtain a radiating effect better than that obtained by a product employing via holes.

To verify this, temperature of two SAW duplexers, one of which employs heat-transferring via holes and the other of which employs a lid according to the present invention, were measured by infrared cameras. Conditions of the test are disclosed in the following Table 1.

TABLE 1

| Conditions of heat-radiation test | |
|---|---|
| Heating power (W) | 0.6, 0.8, 1.0, 1.2, 1.4 |
| Heating time (min) | 60 and more |
| Air feeding velocity (ft/min) | 0 |
| Ambient temperature (° C.) | 18 |

Results of the test carried out under the conditions are disclosed in the following Table 2.

TABLE 2

| | Maximum temperature (° C.) | |
|---|---|---|
| Heating power (W) | Radiating lid | Via holes |
| 0.6 | 34.4 | 35.1 |
| 0.8 | 38.5 | 39.6 |
| 1.0 | 41.8 | 43.5 |
| 1.2 | 44.4 | 46.8 |
| 1.4 | 46.3 | 49.6 |

As seen in Table 2, it can be appreciated that a ceramic package using a lid according to the present invention can obtain excellent heat-radiating effect, since heat radiation is carried out through the lid having an increased surface area.

As described above, the present invention provides a ceramic package with a radiating lid in which the radiating lid is provided thereon with protrusions to increase its surface area, and is attached to the ceramic package by a brazing process, in order to improve the heat-radiating effect.

Since the ceramic package according to the present invention uses the improved lid, the ceramic package can obtain sufficient heat-radiating effect even though there are no via holes.

Furthermore, since the ceramic package according to the present invention uses the lid having protrusions and allows via holes to be removed from its laminated substrate, it is possible to avoid a limit of design of the phase control circuit, and to facilitate the mounting of a chip-type device on the ceramic package, thereby simplifying its manufacturing process and improving its productivity.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A ceramic package, comprising:
   a plurality of ceramic substrates stacked such that a cavity is defined in a central portion thereof;
   a chip mounted on the bottom of the cavity of the ceramic substrates; and
   a lid attached to the top of the ceramic substrates to close the cavity, provided at its upper surface with a grooved portion having grooves, and provided at its lower surface with a downwardly protruded, stepped surface, the lower protruded, stepped surface being fitted into an upper inlet portion of the cavity and being provided with protrusions;
   wherein the grooves are formed in a central region of the upper surface corresponding to the downwardly protruded, stepped surface, whereby the downwardly protruded, stepped surface compensates for the weakening of the lid caused by the grooves.

2. The ceramic package as set forth in claim 1, in which the grooved portion of the lid comprises a plurality of protrusions extended longitudinally.

3. The ceramic package as set forth in claim 1, in which the grooved portion of the lid comprises a plurality of pin-shaped protrusions.

4. The ceramic package as set forth in claim 1, in which the grooved portion of the lid comprises a plurality of grooves extended longitudinally.

5. The ceramic package as set forth in claim 1, in which the grooved portion of the lid comprises a plurality of grooves of pin-shaped sections.

6. The ceramic package as set forth in claim 1, wherein the grooves are provided in a predetermined upper surface portion of the lid, the predetermined upper surface portion being formed flush with or lower than the entire upper surface of the lid.

7. The ceramic package as set forth in claim 1, wherein an entirety of the lid is physically spaced from the chip.

8. A ceramic package, comprising:
   a laminated ceramic substrate having a cavity defined in a central region thereof;
   a chip mounted on a bottom of the cavity;
   a lid attached to an upper surface of said substrate to close a top opening of said cavity; and
   a plurality of heat dissipating protrusions that extend downwardly from a lower surface of said lid and inwardly of said cavity;
   wherein said lid has a stepped configuration comprising an upper portion attached to the upper surface of said substrate and a lower portion fit in said opening of said cavity, said lower portion being at least partially received within said cavity;
   wherein said upper portion includes a central portion and a peripheral portion, said peripheral portion having an upper side and a lower side attached to the upper surface of said substrate, said central portion having a depression in which upwardly extending projections are arranged, wherein said upwardly extending projections do not extend above a level of the upper side of said peripheral portion; and
   wherein said depression is placed corresponding to the lower portion whereby the lower portion at least partially received within said cavity compensates for the weakening of said lid caused by said depression.

9. The ceramic package as set forth in claim 8, wherein a lower portion of said lid including said lower surface and said protrusions are located within said cavity.

10. The ceramic package as set forth in claim 8, wherein said protrusions are completely located within said cavity.

11. The ceramic package as set forth in claim 8, wherein said lower portion defines said lower surface and said protrusions extend from said lower portion downwardly inwardly of said cavity.

12. The ceramic package as set forth in claim 8, wherein upper ends of said projections are flush with the upper side of said peripheral portion.

13. The ceramic package as set forth in claim 8, wherein an entirety of the lid is free of direct, physical contact with the chip.

14. A ceramic package, comprising:
   a laminated ceramic substrate having a cavity defined in a central region thereof;
   a chip mounted on a bottom of the cavity;
   a lid attached to an upper surface of said substrate to close a top opening of said cavity, wherein said lid has a stepped configuration comprising an upper portion attached to the upper surface of said substrate and a lower portion at least partially received within said cavity; and
   a plurality of heat dissipating protrusions that extend upwardly from said lid and outwardly of said cavity;
   wherein said upper portion includes a central portion and a peripheral portion, said peripheral portion having an upper side and a lower side attached to the upper surface of said substrate, said central portion having a depression in which said protrusions are arranged, wherein said protrusions do not extend above a level of the upper side of said peripheral portion;
   wherein upper ends of said protrusions are flush with the upper side of said peripheral portion;
   wherein said depression is placed corresponding to the lower portion whereby the lower portion at least partially received within said cavity compensates for the weakening of said lid caused by said depression; and
   wherein a lower surface of said lower portion of said lid is located immediately beneath said protrusions and is planar.

15. The ceramic package as set forth in claim 14, wherein an entirety of the lid is physically spaced from the chip.

* * * * *